United States Patent [19]
Liu

[11] Patent Number: 6,037,660
[45] Date of Patent: Mar. 14, 2000

[54] DEVICE FOR SECURING A FINNED RADIATING STRUCTURE TO A COMPUTER CHIP

[76] Inventor: Yen-Wen Liu, 13F. No. 90, Chiu Kang St., Wen Shan Dist., Taipei, Taiwan

[21] Appl. No.: 09/072,685

[22] Filed: May 6, 1998

[51] Int. Cl.[7] .............................. H01L 23/26; H01L 7/20
[52] U.S. Cl. .................... 257/722; 257/719; 257/726; 257/727; 257/718; 165/80.3; 165/185; 361/697
[58] Field of Search .................... 257/722, 719, 257/718, 206, 726, 727; 361/697, 704, 687, 719; 165/104.33, 121, 122; 174/16.3

[56] References Cited

U.S. PATENT DOCUMENTS

| | | | |
|---|---|---|---|
| 5,014,777 | 5/1991 | Sano ........................................ | 165/185 |
| 5,507,619 | 4/1996 | Wang ...................................... | 361/497 |
| 5,602,719 | 2/1997 | Kinion .................................... | 361/704 |
| 5,603,374 | 2/1997 | Wu ......................................... | 257/719 |
| 5,650,912 | 7/1997 | Katsui et al. ........................... | 361/697 |
| 5,664,624 | 9/1997 | Tsai et al. ............................... | 257/719 |
| 5,706,169 | 1/1998 | Yeh ........................................ | 361/697 |
| 5,710,694 | 1/1998 | Chen ...................................... | 257/719 |
| 5,730,210 | 3/1998 | Kou ....................................... | 257/719 |
| 5,771,153 | 6/1998 | Sheng ..................................... | 361/697 |
| 5,808,236 | 9/1998 | Brezina et al. ......................... | 174/16.3 |
| 5,828,550 | 10/1998 | Horng .................................... | 361/697 |
| 5,864,464 | 1/1999 | Lin ......................................... | 361/697 |

*Primary Examiner*—Alexander Oscor Williams
*Attorney, Agent, or Firm*—Bacon & Thomas

[57] ABSTRACT

The present invention relates to a type of chips radiating structure, there being a radiating plate on the chips on an interface card, and a fixing unit on the radiating plate; wherein said fixing unit has a main unit to be mounted on the radiating plate and a number of pressing arms that extend from the main unit, said pressing arm has a through hole, serving to be inserted by a fastener which penetrates said hole and the fixing hole on the interface card, so that the radiating plate is fastened onto the chips; said fixing unit serves to securely fasten the radiating plate onto the chips, so designed that the radiating plate will quickly dissipate the heat energy generating from the chips, to ensure the normal operation of the chips.

4 Claims, 4 Drawing Sheets

DEVICE FOR SECURING A FINNED RADIATING STRUCTURE TO A COMPUTER CHIP

FIELD OF THE INVENTION

The present invention relates to a type of chips radiating structure, particularly to one that will securely fasten a radiating plate onto the chips on the interface card, so said radiating plate will quickly dissipate the heat generating from the chips, to ensure the normal operation of the chips.

BACKGROUND OF THE INVENTION

With the advancement of technology and science development in the past few years, we have seen ever-changing types and models of appliances and components related to personal computers, such as hardware, interface cards, central processors, etc., with increasing data-processing capacities and processing speed; however, data processing at higher speeds has also resulted in higher operating temperature to the integrated circuits and the insides of the personal computer sets, even the chips on the interface card would generate high heat in processing the data, therefore, their normal operation would be influenced if the heat is not duly dissipated, which will result in reduced speed and bad effects on their service life, therefore, the installation of heat radiating plates aimed at radiating the heat source (i.e. the chips) has become a popular solution.

As is known to the trade, a conventional application is to glue the reverse side of the radiating plate which is fastened to the chips, but the glue will be melted when it is subjected to heat, resulting in the separation of the radiating plate from the chips, so the heat radiating effect is lost, and besides, the melted glue will seep down onto the interface card, and since the interface card is full of circuits and various electronic components, their normal operation could be influenced.

OBJECTIVE OF THE INVENTION

Aimed to the above, the present invention has provided a type of chips radiating structure, particularly to one that will securely fasten the radiating plate onto the chips on the interface card, so said radiating plate will be able to rapidly dissipate the heat energy generating from the chips, to ensure the normal operation of the chips. Said device is installed near the heat source, with a fan to increase air flow to reduce the accumulation of heat, and avoid any damage to the circuits or reduction of their efficiency.

The technical contents and preferred embodiment of the invention are described below with drawings:

DETAILED DESCRIPTION OF PREFERRED EMBODIMENT

Figure 1:
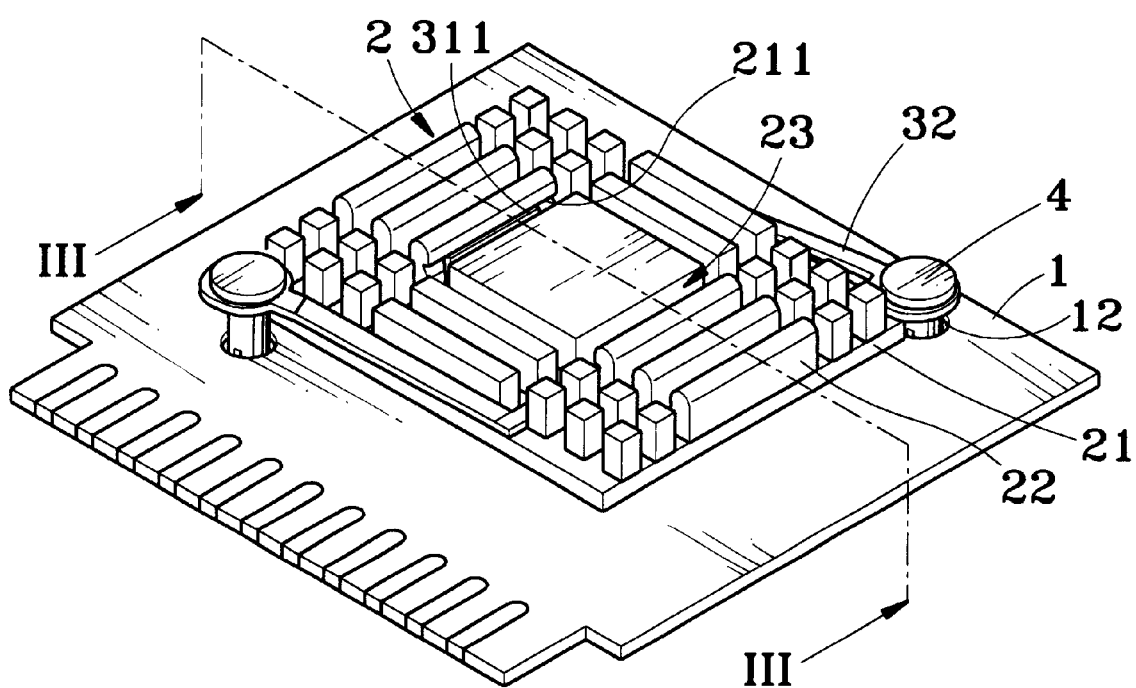
FIG. 1 is a perspective view of the invention.
Figure 2:
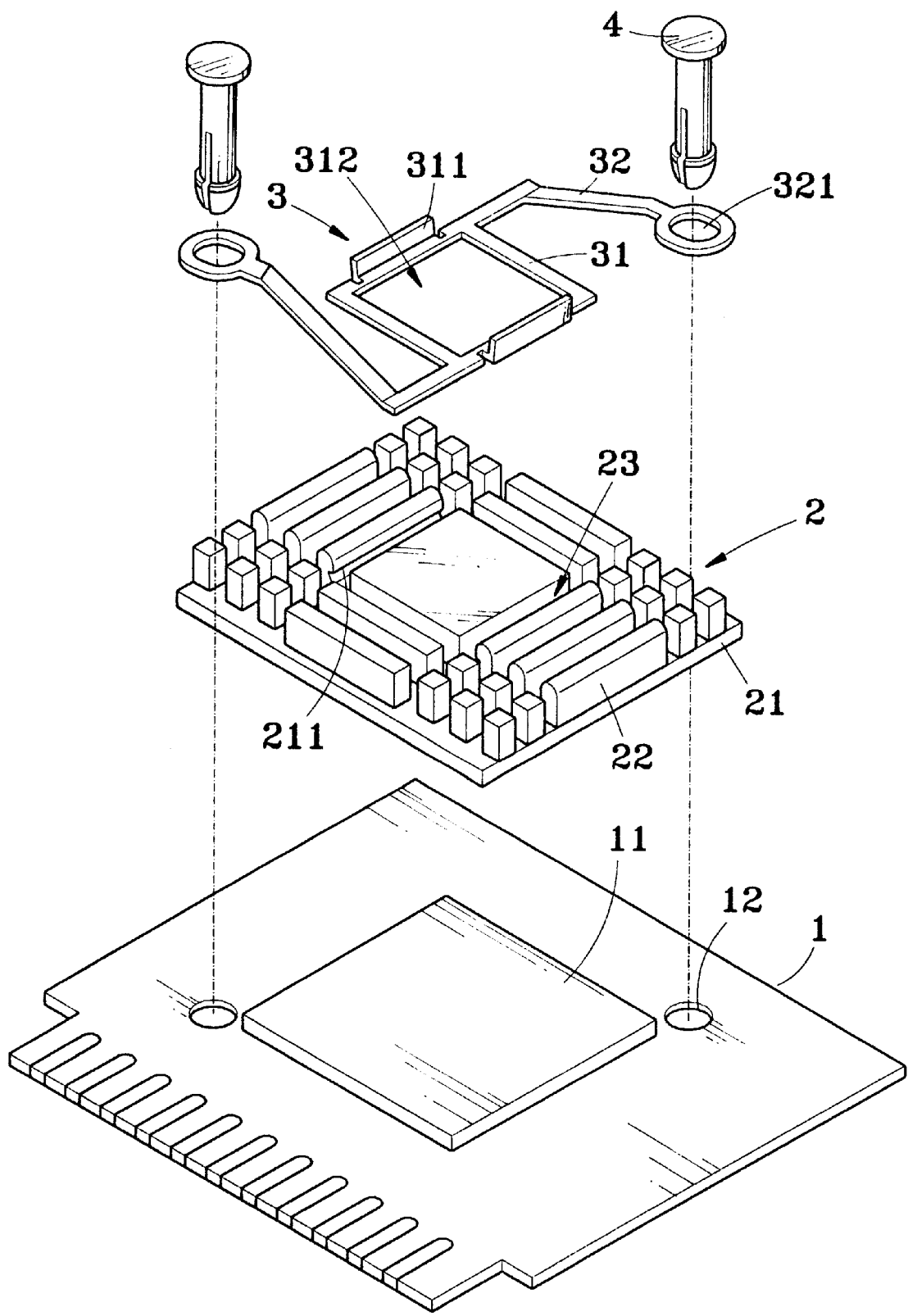
FIG. 2 is an exploded view of the invention.
Figure 3:
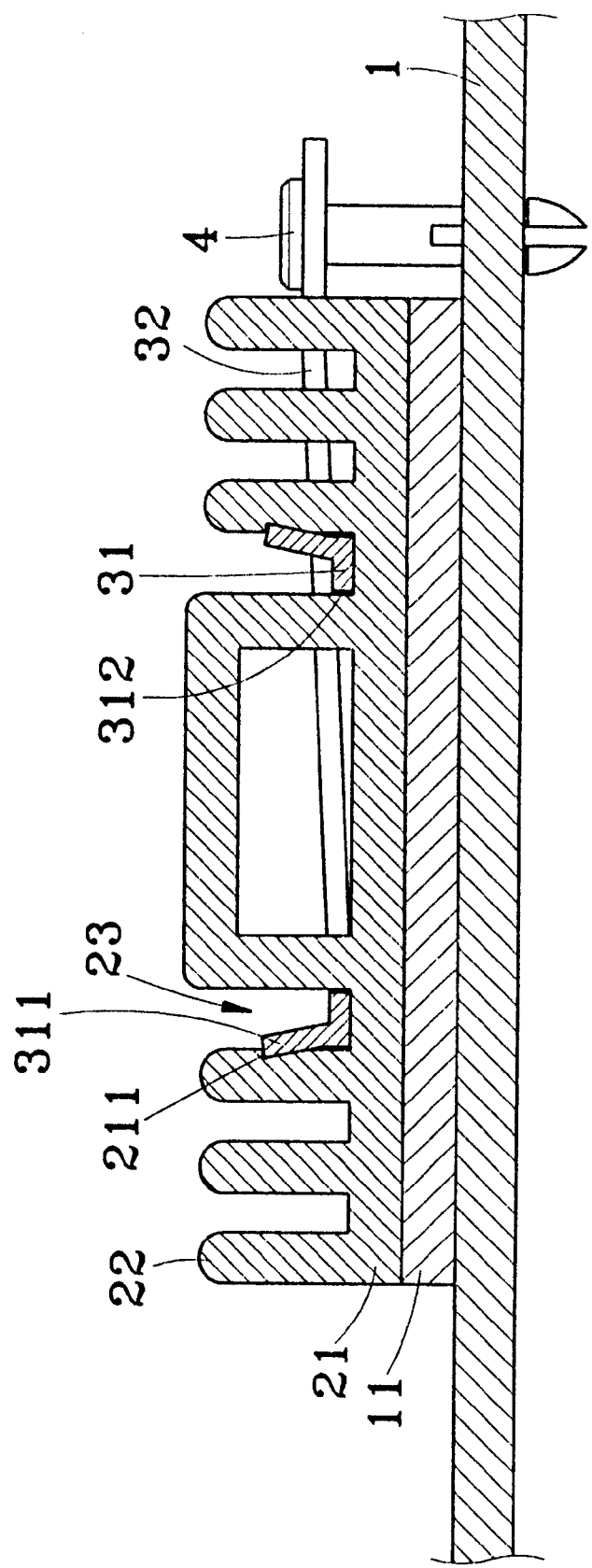
FIG. 3 is a section view of the section marked III—III in FIG. 1.

Please refer to FIGS. 1, 2 and 3, the present invention relates to a type of chips radiating structure, comprising mainly of a radiating plate 2 on the chip 11 of the interface 1, on said radiating plate 2 is a fixing unit 3.

On the plate body 21 of said radiating plate 2 is the formation of a number of radiating fins 22, and on each of said radiating fin 22 is the formation of a groove 221; while the fixing unit 3 is made of an elastic metal plate, involving a main unit 31 and a number of pressing arms 32 that extend upwards from the main unit 31, on said main unit 31 corresponding and matching to said groove 221 is a catch part 311, and at the end of said pressing arm 32 is a hole 321.

Figure 4A:
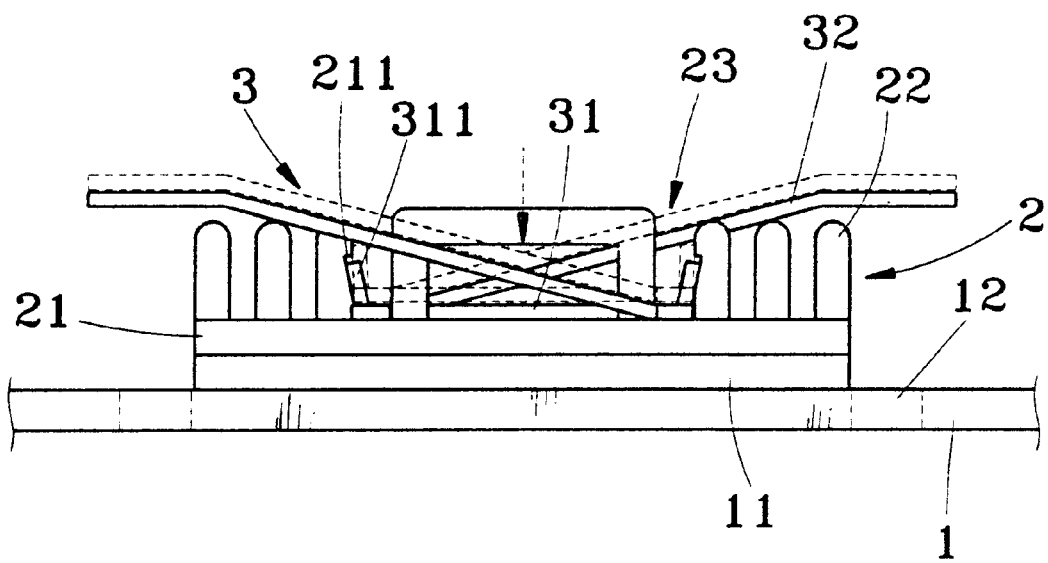
FIG. 4A is an assembling view of the invention.
Figure 4B:
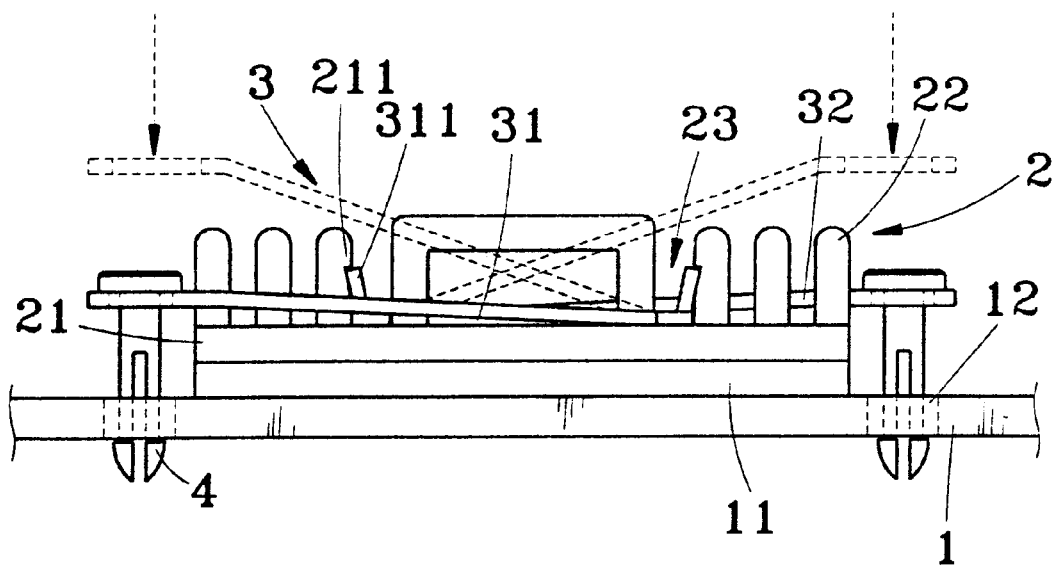
FIG. 4B is another assembling view of the invention.

Please refer to FIGS. 4A and 4B which illustrate how the radiating plate 2 and the fixing unit 3 are assembled on the interface card 1; first, said catch part 311 is snapped onto the groove 221, to fix said main unit 31 onto the radiating plate 2, and after said radiating plate 2 and the fixing unit 3 are fixed, said radiating plate 2 is pressed onto the chip 11 on the interface card 1, then said pressing arms 32 are depressed to force said main unit 31 to press onto the radiating plate 2, so said radiating plate 2 is tightly sticking onto the chip 11, and since after said pressing arms 32 are depressed, the location of the hole 321 is aligned justly to the fixing hole 12 on the interface card 3, then a fastener 4 is inserted through said hole 321 and said fixing hole 12 to fasten the radiating plate 2 onto the chip 11.

Referring again to FIG. 2, on the main unit 31 of said fixing unit 3 corresponding to the radiating fins 22 on the radiating plate 2 is the formation of a hollow hole 312, so that said main unit 31 can rest in the channels 23 between the radiating fins 22.

Summing up, the fixing unit of the invention will securely fasten the radiating plate onto the chips on the interface card, so the radiating plate could rapidly dissipate the heat produced from the chips, in order to assure the normal operation of the chips; it is obvious that the present invention of chips radiating structure has its applicability and originality; however, the above description covers only the preferred embodiment of the invention, therefore it shall not be based to restrict or limit the scope of the present invention, and that all alterations and/or modifications deriving from the invention shall be included in the subject claims.

What the invention claimed is:

1. A radiating structure for a computer chip on a card, comprising:
    a radiating plate, mounted on the chip having a plurality of radiating fins forming at least one groove therebetween;
    a fixing unit, including a main unit and a plurality of pressing arms that extend from the main unit said main unit having catch parts that are matched to and pressed into said groove for fastening said main unit on the radiating plate, and each of said pressing arms having a hole; and
    wherein a fastener penetrates said hole and a fixing hole on the card for fastening the radiating plate onto the chip.

2. The radiating structure as recited in claim 1, wherein on said main unit corresponding to the radiating fins of the radiating plate is a hollow hole.

3. The radiating structure as recited in claim 1, wherein said fixing unit is made of an elastic metal plate.

4. The radiating structure as recited in claim 1, wherein at least a portion of at least one of said pressing arms is resiliently biased away from the card.

* * * * *